US005688698A

United States Patent [19]
Robinson et al.

[11] Patent Number: 5,688,698
[45] Date of Patent: Nov. 18, 1997

[54] METHOD OF FABRICATING A DEVICE HAVING A WAFER WITH INTEGRATED PROCESSING CIRCUITS THEREON

[75] Inventors: Douglas S. Robinson; Terrence C. Jensen; Joseph N. Gray, all of Ames, Iowa

[73] Assignee: Iowa State University Research Foundation, Ames, Iowa

[21] Appl. No.: 475,331

[22] Filed: Jun. 7, 1995

Related U.S. Application Data

[62] Division of Ser. No. 220,913, Mar. 31, 1994, Pat. No. 5,500,534.

[51] Int. Cl.$^6$ .................................................. H01L 31/115
[52] U.S. Cl. ........................................ 437/3; 437/2
[58] Field of Search ................. 437/2, 3, 5; 250/370.09, 250/385.1, 374, 395; 257/660, 428, 444, 759

[56] References Cited

U.S. PATENT DOCUMENTS

| | | |
|---|---|---|
| 4,769,547 | 9/1988 | Uber, III ................................. 250/374 |
| 4,804,847 | 2/1989 | Uber, III ................................. 250/389 |
| 5,126,567 | 6/1992 | Dempsey et al. ....................... 250/374 |
| 5,157,589 | 10/1992 | Cole et al. .............................. 257/444 |
| 5,273,910 | 12/1993 | Tran et al. ................................. 437/3 |
| 5,352,897 | 10/1994 | Horikawa et al. .................. 250/370.06 |
| 5,381,013 | 1/1995 | Cox et al. ........................... 250/370.09 |
| 5,464,987 | 11/1995 | Cox et al. ........................... 250/370.11 |
| 5,498,880 | 3/1996 | Lee et al. ............................ 250/370.09 |
| 5,500,534 | 3/1996 | Robinson et al. ..................... 257/385.1 |

FOREIGN PATENT DOCUMENTS

| | | | |
|---|---|---|---|
| 2 602 058 | 1/1988 | France ............................. G01T 1/14 |
| 61-206258 | 9/1986 | Japan ..................................... 257/444 |
| 62-268144 | 11/1987 | Japan ..................................... 257/759 |
| 5-226500 | 9/1993 | Japan ..................................... 257/759 |

OTHER PUBLICATIONS

F. Hartjes et al., "A Prototype Microstrip Gas Detector," Nuclear Instruments and Methods in Research, A289, pp. 384–387, (1990).

Budtz–Jorgensen et al., "X–ray imaging with the XPECT/SODART microstrip proportional counters," X–Ray and Gamma Ray–Instrumentation for Astronomy III, SPIE vol. 1743 EUV, pp. 162–173 (1992).

Fulton et al., "Microstrip proportional counter development at MSFC," X–Ray and Gamma–Ray Instrumentation for Astronomy III, SPIE vol. 1743 EUV, pp. 125–132 (1992).

B.D. Ramsey, "The Microstrip Proportional Counter," X–Ray and Gamma–Ray Instrumentation for Astronomy III, SPIE vol. 1743 EUV, pp. 96–103 (1992).

Oed et al., "Substratum and layout parameters for microstrip anodes," Nuclear Instruments and Methods in Physics Research, A310, pp. 95–97 (1991).

Hartjes et al., "Operation of the microstrip gas detector," Nuclear Instruments and Methods in Physics Research, A310, pp. 88–91 (1991).

(List continued on next page.)

Primary Examiner—John Niebling
Assistant Examiner—S. Mulpuri
Attorney, Agent, or Firm—Fleshner & Kim

[57] ABSTRACT

An integrated x-ray detection system includes an x-ray detector fabricated on a wafer with a housing for containing a gas. The detector has a plurality of microstrip anodes and the housing passes x-rays which partially ionize the gas thereby producing a pulse at one of the anodes. The same wafer also has a plurality of integrated active signal processing circuits which are respectively coupled to the anodes. Each active signal processing circuit receives and processes pulses from respective ones of the anodes and outputs a digital signal indicating the location and energy of x-rays detected by the detector. An isolation layer separates the x-ray detector from the active signal processing circuits.

12 Claims, 11 Drawing Sheets

OTHER PUBLICATIONS

Stahl et al., "First steps towards a foil microstrip chamber," Nuclear Instruments and Methods in Physics Research, A297, pp. 95–102, (1990).

A. Oed, "Position–Sensitive Detectors with Microstrip Anode for Electron Multiplication with Gases," Nuclear Instruments and Methods in Physics Research, A263, pp. 351–359 (1988).

A. Angelini et al., "A Microstrip Avalanche Chamber With Two Stages of Gas Amplification," Nuclear Instruments and Methods in Physics Research, A292, pp. 199–200 (1990).

Angelini et al., "The Microstrip Gas Avalanche Chamber: A New Detector for the Next Generation of High Luminosity Machines," Cern, Geneva–Switzerland.

Angelini et al., "A microstrip gas chamber with true two–dimensional and pixel readout," Nuclear Instruments and Methods in Physics Research, A323, pp. 229–235 (1992).

Angelini et al., "The Microstrip Gas Chamber," Nuclear Physics B (Proc. Suppl.) vol. 23A, pp. 254–260 (1991).

T. Tanimori et al., "Gamma–Ray Detectors," SPIE vol. 1734, pp. 68–74 (1992).

F. Angelini et al. "A microstrip gas chamber on a silicon substrate," Nuclear Instruments and Methods in Physics Research, A314, pp. 450–454 (1992) pp. 99–121.

Biagi et al., "Initial investigations of the performance of a microstrip gas–avalanche chamber fabricated on a thin silicon–dioxide substrate," Nuclear Instruments and Methods in Physics Research, A323, pp. 258–262 (1992).

Barasch et al., "Gas Microstrip Detectors on Polymer, Silicon and Glass substrates," Nuclear Physics II (Proc. Suppl.) vol. 32, pp. 216–222 (1993).

Angelini et al., "The micro–gap chamber," Nuclear Instruments and Methods in Physics Research, A335, pp. 69–77 (1993).

C. Budtz–Jorgensen, "Features of the microstrip proportional counter technology (invited)," Rev. Sci. Instrum., vol. 63, No. 1, pp. 648–654 (Jan. 1992).

Minakov et al., "Performance of gas microstrip chambers on glass with ionic and electronic conductivity," Nuclear Instruments and Methods in Physics Research, A326, pp. 566–569 (1993).

J. Richter, "Large size microstrip particle detectors," Nuclear Instruments and Methods in Physics Research, A323, pp. 263–265 (1993).

Barbosa et al., "Two dimensional X–ray detector based on microstrip and multiwire design," Nuclear Instruments and Methods in Physics Research, A323, pp. 247–251 (1992).

Bouclier et al, "High flux operation of microstrip gas chambers on glass and plastic supports," Nuclear Instruments and Methods in Physics Research, A323, pp. 240–246 (1992).

Nagae et al., "Development of microstrip gas chambers with multi–chip technology," Nuclear Instruments and Methods in Physics Research, A323, pp. 236–329 (1992).

Angellini et al., "A Microstrip Gas Avalanche Chamber with Two–Dimensional Readout," Nuclear Instruments and Methods in Physics Research, A283, pp. 755–761 (1989).

Oed et al., "A New Position Sensitive Proportional Counter with Microstrip Anode for Neutron Detection," Nuclear Instruments and Methods in Physics Research, A284, pp. 223–226 (1989).

Bouclier et al., "Microstrip Gas Chambers on Thin Plastic Supports," IEEE Transactions on Nuclear Science, vol. 39, No. 4, pp. 650–653 (1992).

Bouclier et al., "Performance of gas microstrip chambers on glass substrata with electronic conductivity," Nuclear Instruments and Methods in Physics Research, A332, pp. 100–106 (1993).

Schmidt et al., "Study of thin substrates for microstrip gas chambers," Nuclear Instruments and Methods in Physics Research, A337, pp. 382.386 (1994).

Pestov et al., "Influence on the bulk resistivity of glass with electronic conductivity on the performance of microstrip gas chamber," Nuclear Instruments and Methods in Physics Research, A338, pp.368–374 (1994).

Savard et al., "An a–Si:H gas microstrip detector," Nuclear Instruments and Methods in Physics Research, A337, pp. 387–393 (1994).

Angelini et al., "A thin, large area microstrip gas chamber with strip and pad readout," Nuclear Instruments and Methods in Physics Research, A336, pp. 106–115 (1993).

Brons et al., "Use of ultra thin semiconductive layers passivation in microstrip gas chambers," Nuclear Instrumentation and Methods in Physics Research, A342, pp. 411–415 (1994).

J. Moromisato et al., "The PC strip detector: towards a large scale gas microstrip counter," Nuclear Instruments and Methods in Physics Research, A345, pp. 90–94 (1994).

Breskin et al., "On the two–stage operation mechanism of low–pressure microstrip gas chambers," Nuclear Instruments and Methods in Physics Research, A345, pp. 205–209 (1994).

Schmidt et al., "Simulation of electrostatic properties and gas amplification in microstrip gas chambers and comparison with measurements," Nuclear Instruments and Methods in Physics Research, A344, pp. 558–570 (1994).

Florent et al., "The electrostatic field in microstrip chambers and its influence on detector performance," Nuclear Instruments and Methods in Physics Research, A329, pp. 125–132 (1993).

Jensen et al., "Application of a Microstrip Proportional Chamber to X–Ray Imaging," Review of Progress in Quantitative Nondestructive Evaluation, vol. 13, pp. 1135–1140 (1994).

Ting et al., "Using Energy Dispersive X–Ray Measurements for Quantitative Determination of Material Loss Due to Corrosion," Review of Progress in Quantitative Nondestructive Evaluation, vol. 12, pp.1963–1969 (1993).

Charpak et al., "The Use of Multiwire Proportional Counters to Select and Localize Charged Particles," Nuclear Instruments and Methods, vol. 68, pp. 262–268 (1968).

Neumann et al., "Modification of the Charpak Chamber with Foil Supported Conductors," IEEE Trans. Nucl. Sci., NS17, vol. 43 (1970).

Budtz–Jorgensen et al., "Microstrip proportional counterrs for X–ray astronomy," Nuclear Instruments and Methods, A310, 82 (1991).

METHOD OF FABRICATING A DEVICE HAVING A WAFER WITH INTEGRATED PROCESSING CIRCUITS THEREON

This application is a division of application Ser. No. 08/220,913, filed Mar. 31, 1994 now U.S. Pat. No. 5,500, 534.

BACKGROUND OF THE INVENTION

1. Field of the Invention

This invention relates generally to method of fabricating devices for spatially detecting x-rays of varying wavelengths and in particular methods of fabricating an integrated x-ray detection system which can efficiently detect x-rays with energies in the range from approximately 1 keV to approximately 150 keV with an energy resolution as low as 0.5 keV or less and a spatial resolution of less than 100 micrometers.

2. Background of the related Art

The defining characteristics of x-ray imaging technologies include spatial resolution, contrast sensitivity, speed, and cost. In addition, recently developed techniques for quantifying material composition require x-ray energy sensitivity. (See Ting et al., "Using Energy Dispersive X-ray Measurements for Quantitative Determination of Material Loss Due to Corrosion", in Review of Progress in Quantitative Nondestructive Evaluation, Vol. 12B, 1963, eds. D. O. Thompson and D. E. Chimenti, Plenum Press, New York (1993).) Many practical applications also require imaging under severe environmental conditions or in restricted spaces. Since no single x-ray detector offers optimum performance in all of the above areas, compromises must often be made.

X-ray detection technologies exhibiting energy sensitivity generally fall into two broad categories: wavelength dispersive systems or energy dispersive systems. In the former, Bragg diffraction from either a natural or artificial crystal is combined with collimating optics such that only those x-rays within an energy band determined by the geometry of the collimating optics and the lattice spacing of the diffracting crystal are allowed to impinge on an x-ray sensitive element. In such a system, the x-ray detector need not have any intrinsic energy sensitivity, since the collimating optics and crystal act as a filter and only allow certain wavelengths to reach the detector. Such wavelength dispersive systems generally have very limited throughputs both because the geometry of the incident x-ray optical system must be changed to allow detection of different energy photons, and because they are only a single pixel or point detection system.

Energy dispersive x-ray detection systems, on the other hand, generally rely on the photoelectric interaction between the incident quantum of radiation and a medium that results in the production of a number of charged particles in proportion to the energy of the incident photon. When the medium is a semiconductor such as silicon, germanium, or cadmium telluride, the electrons and holes generated by the interaction can be collected, and the amount of charge is a direct measure of the energy given up by the incident photon. Alternatively, the medium may be a gas that is ionized by the radiation such as in a gas proportional tube. Because energy dispersive detectors are intrinsically capable of distinguishing different wavelength photons, they are capable of rapid throughput. In addition, if the interaction medium is compartmentalized in some fashion, these detectors can be made to have many simultaneously active pixels, further improving the throughput of the system.

Gas proportional counters have been used for many years to detect ionizing radiation. Familiar Geiger counters are a close relative of this detector.. In its simplest form, proportional counter 102 consists of a cylindrical outer cathode 110 with a small diameter anode wire 114 along axis A as shown in FIG. 1A. FIG. 1B shows a cross-sectional view of proportional counter 102- Volume B is typically filled with a gas 118 such as argon or xenon plus a few percent of a quenching gas such as methane. Electrons liberated by interaction of an x-ray or charged particle in gas 118 are driven toward anode 114 by an electric field. The electric field is produced when a voltage is applied by power supply 122 with leads 126a and 126b connected to cathode 110 and anode 114, respectively. Near anode 114, thus electric field varies as 1/r enough such that electrons are accelerated to energies sufficient to ionize the gas molecules, thus generating an avalanche of electrons between anode 114 and cathode 110. The multiplicative gain in this process depends on the properties of the gas 118, the diameter d of anode 114, and the high voltage potential between anode 114 and cathode 110. This gain can be as high as $10^6$. Anode 114 is typically connected to electronic circuitry 150 to amplify and digitize the signal. A pulse of height h is produced at anode 114, where h is proportional to the number of electrons initially liberated in the interaction with the gas 118. The number of electrons liberated in this initial interaction between the quantum of ionizing radiation and the gas 118 is in turn proportional to the energy of the incident quantum of radiation. This is why counter 102 is referred to as a "proportional counter".

Counter 102, however, has a drawback for x-ray imaging in that it provides very little spatial information. In 1968, Charpak improved on this with the introduction of a multiwire proportional chamber. (See G. Charpak et al., "The Use of Multiwire Proportional Counters to Select and Localize Charged Particles", Nucl. Instrum. Methods 62, 262 (1968).) In that device, many parallel anode wires are positioned in a common gas volume..Each anode wire behaves as a proportional counter and can be connected to a separate electronic circuit to give position information. The spatial resolution, however, of these multiwire proportional chambers is limited because the wires cannot be placed closer than about 1 millimeter apart without becoming unstable. Such multiwire proportional chambers are also quite fragile, which has limited their use even more.

A new technology related to multiwire proportional chambers which offers promise in improving both spatial resolution and mechanical ruggedness is the microstrip proportional chamber. (See A. Oed, "Position-Sensitive Detector with Microstrip Anode for Electron Multiplication with Gases", Nucl. Instrum. Methods, A263, 351 (1988).) This device has been developed for research in astrophysics and high-energy physics. Its properties make it an attractive choice for x-ray imaging applications. It is conceptually similar to a multiwire proportional counter, but instead of parallel anode wires stretched across a gas volume, the anodes are fabricated by patterning a thin metal layer which adheres to a solid substrate. The solid supporting substrate allows anodes to be fabricated both that are narrower and have closer spacing than is possible with freely suspended wires. In addition once fabricated the adherence of the metal anodes to a solid insulating substrate prevents mechanical vibration and shock from causing relative movement and consequent short-circuiting of the anodes, thus greatly improving reliability.

While several research groups have tested many different substrate materials for fabrication of microstrip gas proportional chambers, we know of only three groups that have explored the use of silicon. The first group (See F. Angelini, et el., "A microstrip gas chamber on a silicon substrate", Nucl. Instrum. Methods, A314, 450, (1992).) used a low resistivity (i.e., heavily doped) silicon substrate with a thermally grown oxide layer for electrical isolation of the anodes and a conductive contact to the back of the silicon. In this implementation, the silicon is a conductor and is used as one of the electrodes of the chamber. This heavy doping renders the silicon useless for active device fabrication. The second group (See S. F. Biagi, et at., "Initial investigations of the performance of a microstrip gas-avalanche chamber fabricated on a thin silicon-dioxide substrate", Nucl. Instrum. Methods, A323, 258, (1993).) did not indicate the resistivity of their substrate, but used a combination of thermal oxidation and plasma enhanced chemical vapor deposition to build an insulating layer for the anodes and placed the silicon substrate between sets of electrodes that must be held at high voltages during operation. The high fields from the electrodes can easily deplete the silicon and render any active devices fabricated in the silicon useless. The third group (See E. F. Barasch, et al., "Gas Microstrip Detectors on Polymer, Silicon and Glass substrates", Nuclear Physics B (Proc. Suppl. ) 32, 216, (1993).) used anisotropic etching of the silicon substrate to etch pedestals to support the anodes and oxidation of the resulting silicon surface to provide electrical isolation of the anodes. Depletion by the electric fields from the electrodes will inhibit active device function. In addition, the etched pedestals are incompatible with the planar fabrication techniques needed to build active devices.

SUMMARY OF THE INVENTION

An object, therefore, of the invention is to provide an integrated x-ray detection system capable of simultaneously providing spatial resolution of detected x-rays and digitized energy resolution data for said x-rays at high throughput rates.

Another object of the invention is to provide an integrated x-ray detection system which is compact and rugged.

Another object of the invention is to provide an integrated x-ray detection system which can be used in digital radiography and computed tomography.

Another object of the invention is to provide an integrated x-ray detection system which allows a user to selectively detect x-rays with energies from specific portions of the incident spectrum by setting lower and upper energy limits for a small number of independent energy intervals or windows.

One advantage of the invention is that it is capable of simultaneously spatially detecting x-rays and distinguishing various x-ray energies.

Another advantage of the invention is that all of its processing circuitry and its x-ray detector can be fabricated on a single wafer or substrate.

Another advantage of the invention is that it enables high speed detection of both energy and position of x-rays.

Another advantage of the invention is that it eliminates the need for a large number of discrete wires and cables connecting x-ray sensitive elements to their associated electronics.

Another advantage of the invention is that it is less susceptible to noise pickup than systems constructed using discrete components and interconnecting cables.

Another advantage of the invention is that it is more reliable and rugged than wired systems.

Another advantage of the invention is that it can be used in digital radiography, computed tomography, monitoring and inspecting of composite materials, airline baggage inspection, corrosion detection, and x-ray detection in diffraction and scattering systems, all of which require spatial detection of x-rays and all of which benefit from energy sensitivity.

One feature of the invention is that it has metallic potential strips patterned onto a substrate or wafer.

Another feature of the invention is that it has multiple microstrip anodes patterned onto the substrate.

Another feature of the invention is that it has active signal processing circuits integrated into the substrate.

Another feature of the invention is that it has a wafer isolation layer above the active signal processing circuits to protect and electrically insulate those circuits from high voltages.

Another feature of the invention is that it has a metallic shield plane between the portions of the x-ray detector with high voltages and the active signal processing circuits to shield those circuits from stray electric fields.

Another feature of the invention is that it involves fabricating the x-ray detector by spin casting polyimide resin layers and curing them at temperatures sufficiently low that the circuits integrated in the substrate are not damaged.

Another feature of the invention is that it has active signal processing electronics including analog and digital circuits.

Another feature of the invention is that each analog circuit for each microstrip anode includes a protection circuit which reduces the potential for damage to the rest of the analog electronics.

Another feature of the invention is that each analog circuit for each microstrip anode includes a pulse shaper which improves the count rate capability of each anode.

Another feature of the invention is that it includes a plurality of energy window circuits following each amplifier circuit for each microstrip anode, wherein these energy window circuits detect pulses within a user specified range and convert said pulses to logic pulses.

Another feature of the invention is that each microstrip anode has digital circuits coupled to its analog circuits and these digital circuits include digital counters, each coupled to a respective energy window circuit in the analog circuits.

Another feature of the invention is that each digital circuit for each microstrip anode is coupled to an internal digital I/O bus which is in turn coupled via an I/O control logic circuit to an external digital interface circuit.

The above and other objects, advantages and features are accomplished by the provision of an integrated apparatus, comprising: a wafer; an x-ray detector fabricated on the wafer having a housing, a plurality of anodes and a gas contained in the housing, wherein at least a portion of the housing passes x-ray photons which partially ionize the gas thereby producing at least one pulse at one of the plurality of anodes; a plurality of active signal processing circuits integrated into the wafer and respectively coupled to the plurality of anodes, wherein a respective one of the plurality of signal processing circuits receives and processes the at least one pulse m a digital signal indicating location of the one of the plurality of anodes and amplitude of the pulse; and an electrically isolating layer for electrically isolating the x-ray detector from the plurality of active signal processing circuits.

The above and other objects, advantages and features of the invention are further accomplished when the plurality of active signal processing circuits comprise a respective plurality of analog circuits coupled to the plurality of anodes and a respective plurality of digital circuits coupled to the plurality of analog circuits, wherein the plurality of analog circuits comprise: a plurality of protection circuits respectively coupled to the plurality of anodes for pulses from the plurality of anodes and for protecting electronic circuits downstream from the anodes; a plurality of amplifiers respectively coupled to the plurality of protection circuits for receiving the pulses and amplifying the pulses to yield amplified pulses; and a plurality of pulse shapers respectively coupled to the plurality of amplifiers for receiving the amplified pulses and outputting shaped pulses, and wherein each of the plurality of digital circuits comprises: a plurality of multiple energy window circuits each of the multiple energy window circuits respectively coupled to the plurality of pulse shapers for receiving the shaped pulses and outputting digital logic pulses when the shaped pulses have amplitudes within an externally selected range; and a plurality of multiple digital counters respectively coupled to the plurality of multiple energy window circuits for receiving and counting the digital logic pulses.

The above and other objects, advantages and features are accomplished by the provision of an integrated x-ray detection system, comprising: a wafer capable of supporting integrated circuitry; a housing for housing the wafer and a gas, wherein at least a portion of the housing passes x-ray photons which partially ionize the gas thereby producing at least one electron; a plurality of anodes fabricated on the wafer, the plurality of anodes being maintained at a first potential; a plurality of potential strips alternately arranged among the plurality of anodes on the wafer and maintained at a second potential; a cathode plane arranged along the wafer and maintained at a third potential; a back potential plane fabricated on the wafer and maintained at a fourth potential, wherein the first, second, third and fourth potentials are selected such that the at least one electron is accelerated toward one of the plurality of anodes with sufficient energy to produce a pulse at the one of the plurality of anodes; a plurality of active signal processing circuits integrated into the wafer and respectively coupled to the plurality of anodes wherein a respective one of the plurality of signal processing circuits receives and processes the pulse to yield a digital signal indicating location of the one of the plurality of anodes and height of the pulse; and an insulation layer for separating the plurality of anodes, the plurality of potential strips and the back potential plane from the active signal processing circuit.

The above and other objects, advantages and features will become more apparent from the following description of embodiments thereof, taken in conjunction with the accompanying drawings.

DETAILED DESCRIPTION OF THE PREFERRED EMBODIMENTS

Figures 1A, 1B:
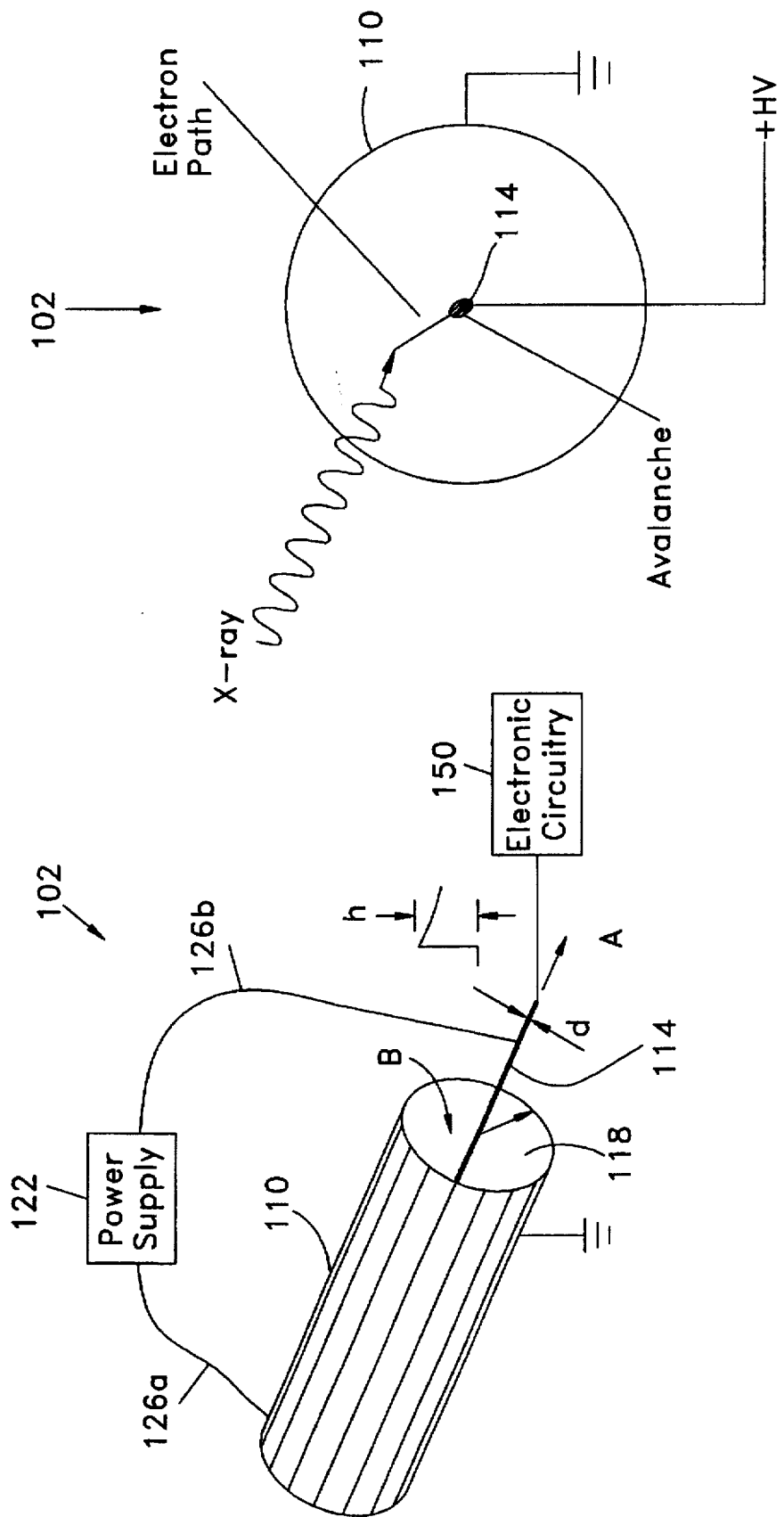
FIG. 1A shows a schematic representation of a proportional counter and FIG. 1B shows a cross-sectional view of that proportional counter.
Figure 2:
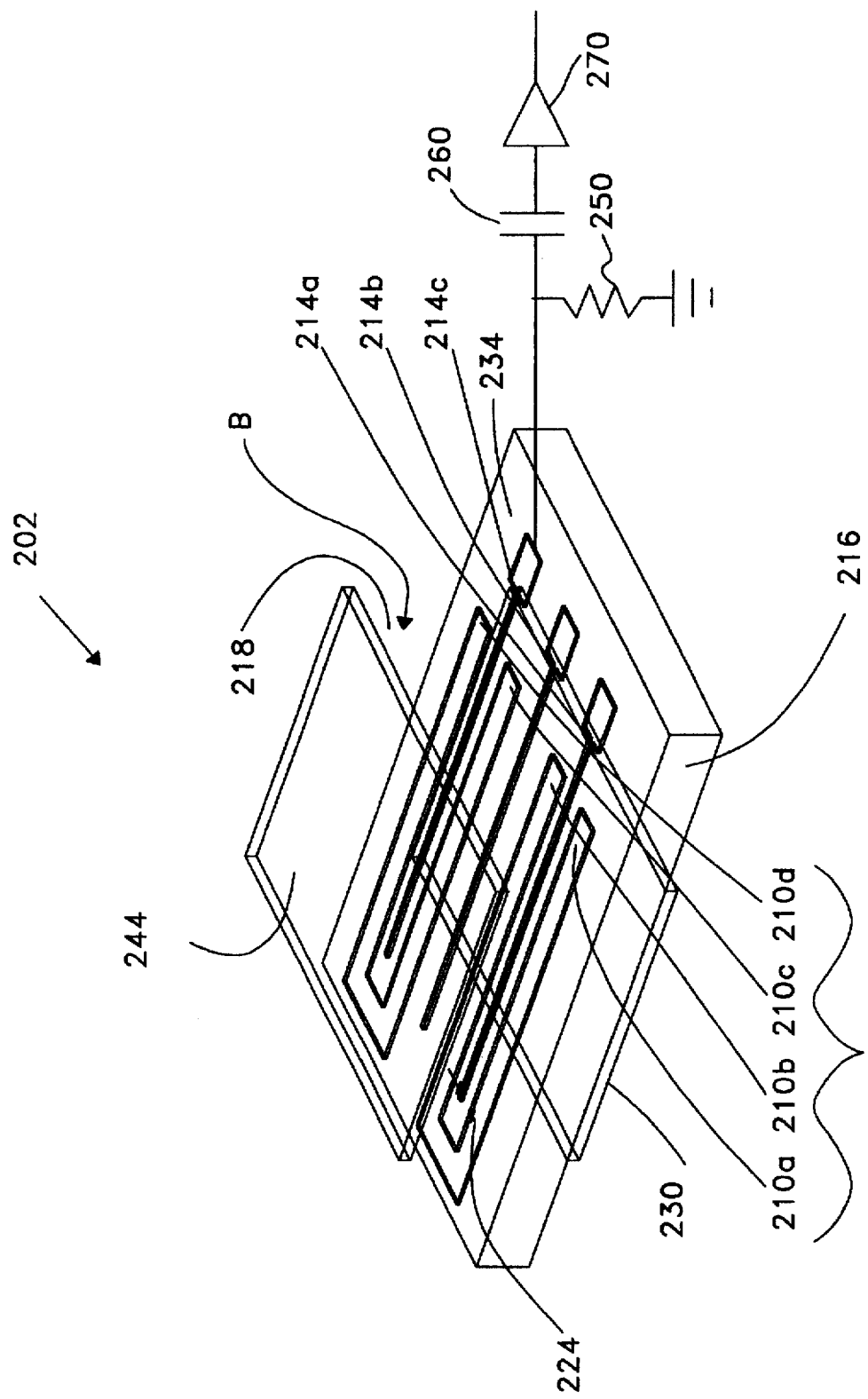
FIG. 2 shows a schematic representation of an x-ray microstrip proportional chamber or detector with multiple microstrip anodes fabricated according to the invention.

FIG. 2 shows a schematic representation of an x-ray microstrip gas proportional chamber or detector 202 fabricated according to the invention and consisting of two equipotential planes (back potential plane 230 and cathode plane 244) with an intervening third plane made up of multiple microstrip anodes 214a–214c and potential strips 210a–210d deposited on and attached to surface 234 of insulating substrate 216. See A. Oed, "Position-Sensitive Detector with Microstrip Anode for Electron Multiplication with Gases", Nucl. Instrum. Methods, A263, 351 (1988), the contents of which are incorporated herein by reference. Anodes 214a–214c and interspaced potential strips 210a–210d are solidly bonded to surface 234 of substrate 216, thus permitting stable operation with much closer spacing than would be possible with the freely suspended wire anodes of a multiwire proportional detector. Although three anodes and four potential strips are shown, any number of such strips can be fabricated and used. Photolithographic techniques are used to pattern a thin aluminum, copper, or other metal layer into potential strips 210a–210d and anodes 214a–214c. Potential strips 210a–210d can be fabricated from less than about 50 µm to more than about 200 µm wide and preferably about 90 µm wide. Anodes 214a–214c can be fabricated from about 1 to 100 µm wide and preferably about 10 µm wide. Insulating gaps 224 between potential strips 210a–210d and anodes 314a–214c can be fabricated from a few µm to several hundred µm and preferably about 50 µm. Insulating substrate 216 can be fabricated from 1 µm to more than 1000 µm thick and preferably about 15 µm thick. Cathode plane 244 can be arranged anywhere from less than 1 millimeter to more than 10 millimeters and preferably about 5 millimeters above surface 234. Cathode plane 244 must be at least partially transparent to x-rays with energies in the desired detection range. A gas 218, which is typically argon-methane or xenon-methane, fills volume B of chamber 202. Cathode plane 244 may serve the dual function of establishing an electric field in volume B and preventing the escape of gas 218, or a separate x-ray transparent window (not shown) may be placed parallel to and in close proximity to cathode plane 244 to allow x-rays to enter volume B while preventing loss of gas 218. This x-ray transparent window is sealed to a pressure cell (not shown) that permits control of the operating pressure of gas 218 in volume B.

When the detector is in operation, voltages applying to each of the four distinct sets of electrodes 230, 210a–210d, 214a–214c, and 244 is used for establishing and controlling electrostatic fields in volume B and in the vicinity of potential strips 210a–210d and anodes 214a–214c. While holding back potential plane 230, potential strips 210a–210d, and cathode plane 244 are held at operating voltages HV1, HV2, and HV3, respectively, holding anodes 214a–214c at ground potential also transpires through a resistor 250, typically 1 to 10 Megohms. Note that potential strips 210a–210d while electrically connecting all together electrically isolated anodes 214a–214c from all other electrodes and connecting them together to a common potential (typically ground) only through large value resistors also occurs. Operating anodes 214a–214c at other potentials by connecting to a power supply is also possible when coupling to signal processing electronics 270 through capacitor 260. When gas 218, mixtures 90% argon and 10% methane at a pressure of about 16 psig, when the microstrip proportional chamber geometry is as described above, and when holding the anodes 214a–214c at 0 volts, values of −200 volts, −500 volts, and −2000 volts for HV1, HV2, and HV3, respectively, have been used testing the performance of the detector. Values of HV1, HV2, HV3, and the anode potentials ranging from 0 to a few thousand volts, positive or negative polarity have been used, depending primarily on the detector geometry, the sizes and spacing of potential strips 210a–210d and anodes 214a–214c, the thickness of insulating substrate 216, the pressure and composition of gas 218, and the distance between cathode plane 244 and surface 234. The key constraints on polarity and magnitude of applied voltages are the electrons resulting from ionization of gas 218 in volume B drifting toward surface 234 and are further accelerating sufficiently by the electric field around one of the anodes 214a–214c giving rise to gas avalanche amplification. Determining optimum values of applied voltages separately for each chamber configuration must occur. In addition, shifting all voltages by the same additive constant voltage may occur with little or no change in detector performance, thus allowing free choice of holding any one of the four at ground potential (0 volts).

Figure 3A:
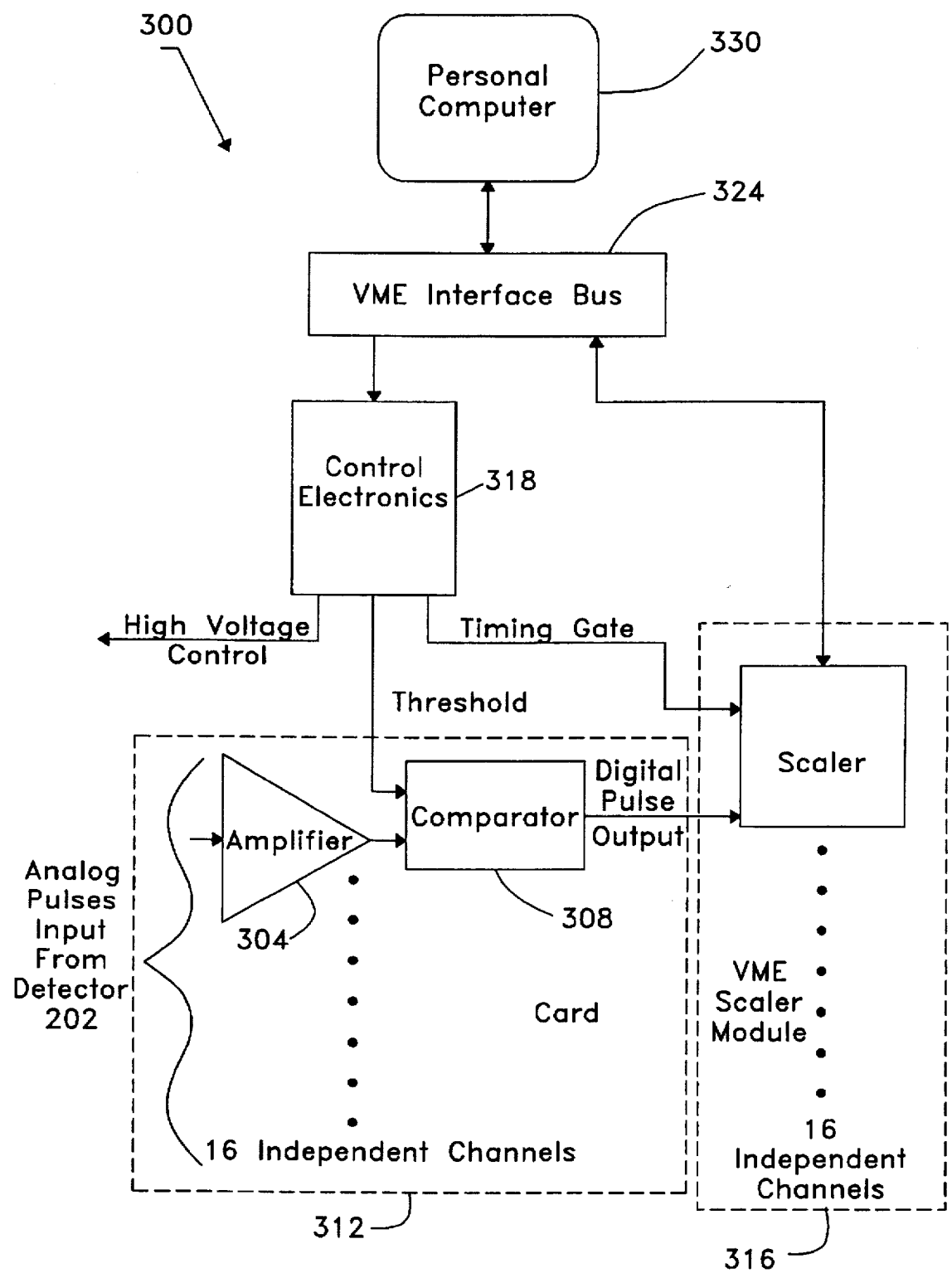
FIG. 3A shows a block diagram of signal processing electronics used to test the microstrip proportional chamber of FIG. 2 by counting together all x-ray photons above a set threshold collected by each microstrip anode separately and FIG. 3B shows a block diagram of signal processing electronics used to test the microstrip proportional chamber of FIG. 2 by digitizing the energy spectrum of x-ray photons collected by a block of 16 microstrip anodes connected together in parallel.

X-rays entering volume B through the x-ray transparent window (if present) and cathode plane are such that each x-ray photon has a probability of ionizing gas 218. Increasing that probability results from increasing both the atomic number and the density of gas 218. Controlling composition and pressure controls these characteristics, respectively, of gas 218. The electric field established by the potential planes accelerates the electrons and ions resulting from an ionizing event in opposite directions, with the electrons moving toward surface 234. Electrons approaching anodes 214a–214c, are further accelerated by the high electric field around that one anode (positive relative to the nearby potential strips) which causes additional ionization. This cascading of events will result in a pulse of charge proportional to the energy of the incoming photon, amplifying as much as a factor of $10^5$ over the charge generated by the original processing circuits, each including protecting amplifying, and shaping circuits, as well as a plurality of energy window circuits and digital counters to be discussed below. For simultaneous (parallel) use of available pixels, each anode 214a–214c must have its Own separate electronic chain. The position of the x-ray ionization event is preserved first by the uniformity of the electric field in the drift region of volume B and next by which one of the plurality of anodes 214a–214c and associated signal processing, digitizing, and counting electronics records a pulse. FIG. 3A shows a block diagram of one version of signal processing electronics 300 used for testing microstrip proportional chamber or detector 202. Each anode of detector 202 was connected to an amplifier 304 and comparator 308 on a commercially available card 312 (LeCroy model 2735PC). Each card 312 contains 16 independent sets of amplifiers and comparators. Card 312 produced a digital output pulse for input signals greater than a comparator threshold voltage output from control electronics 318. Control electronics 318 was an assemblage of modules including: Greenspring Computers model VIPC610 VME bus IndustryPack carrier, model IP-DAC IndustryPack digital to analog converter, and model IP-DUAL PI/T IndustryPack dual programmable interface/timer; a custom built interface buffer circuit; and LeCroy model 429A logic fanout. Pulses were sent from each card 312 to VME scaler module 316 (LeCroy model 1151E) which accumulated statistics separately for each of 16 channels during a preset time interval established by gate signals output to VME scaler module 316 from control electronics 318. For our prototype system, 6 separate cards 312 and 6 separate VME scaler modules 316 acquired data from a total of 96 anodes in our linear array microstrip gas proportional chamber. An interface bus 324 was used to accommodate the 6 VME scaler modules 316 and portions of the control electronics 318. A personal computer 330 allowed us to control the entire system via a data acquisition program.

Figure 3B:
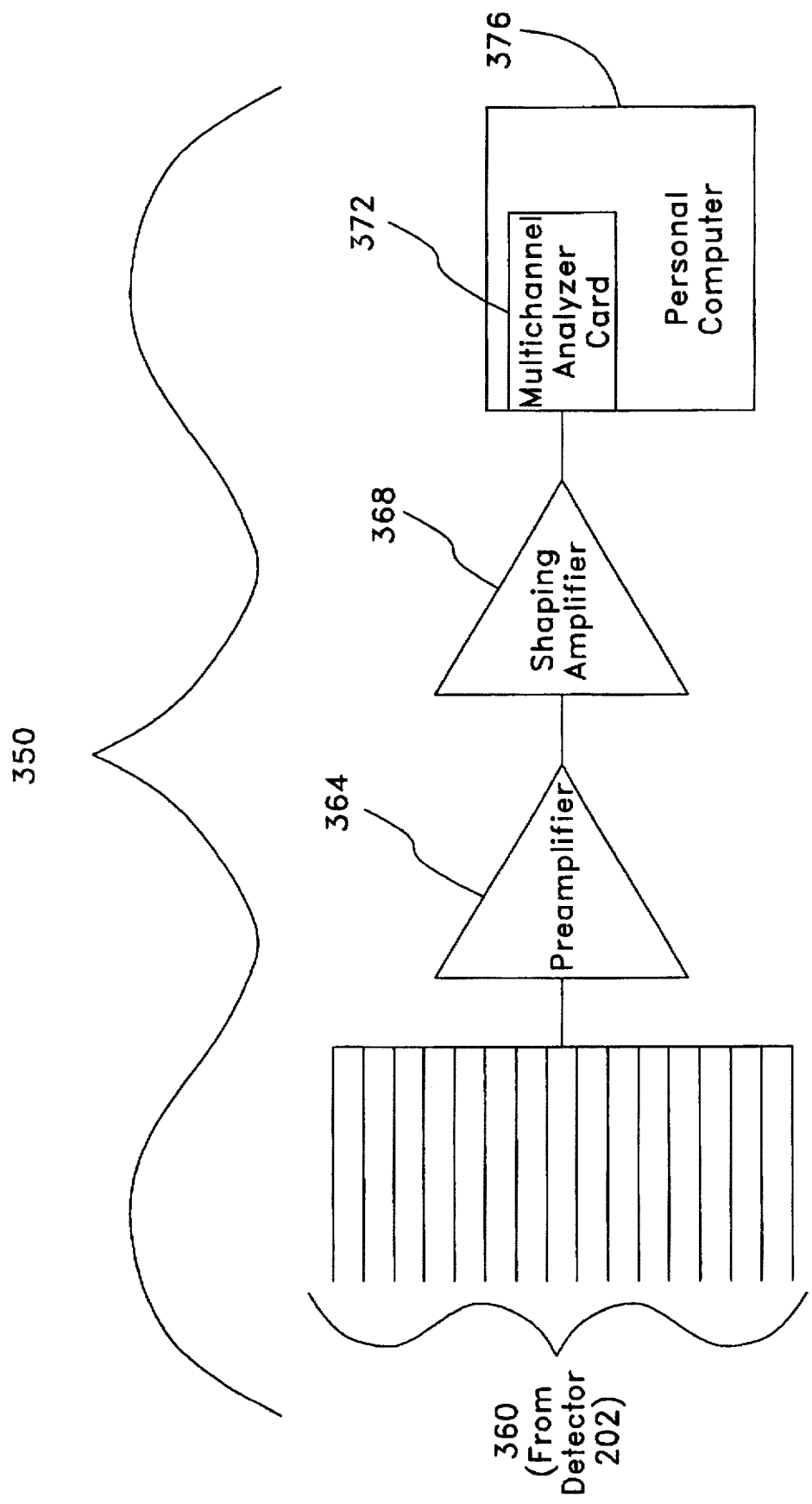

FIG. 3B shows a block diagram of another version of signal processing electronics 350 used for testing microstrip proportional detector 202. A block of 16 anodes or channels 360 of detector 202 Were connected together in parallel and signals from them were connected in turn to the input of a preamplifier 364 (eV Products model 5093). The output of the preamplifier 364 was connected to the input of a shaping amplifier 368 (EG&G Ortec model 572). The linearly amplified and shaped pulses from shaping amplifier 368 were then sent to multichannel analyzer card 372 (EG&G Ortec model 916A) which was housed in and controlled by personal computer 376.

Figure 4A:
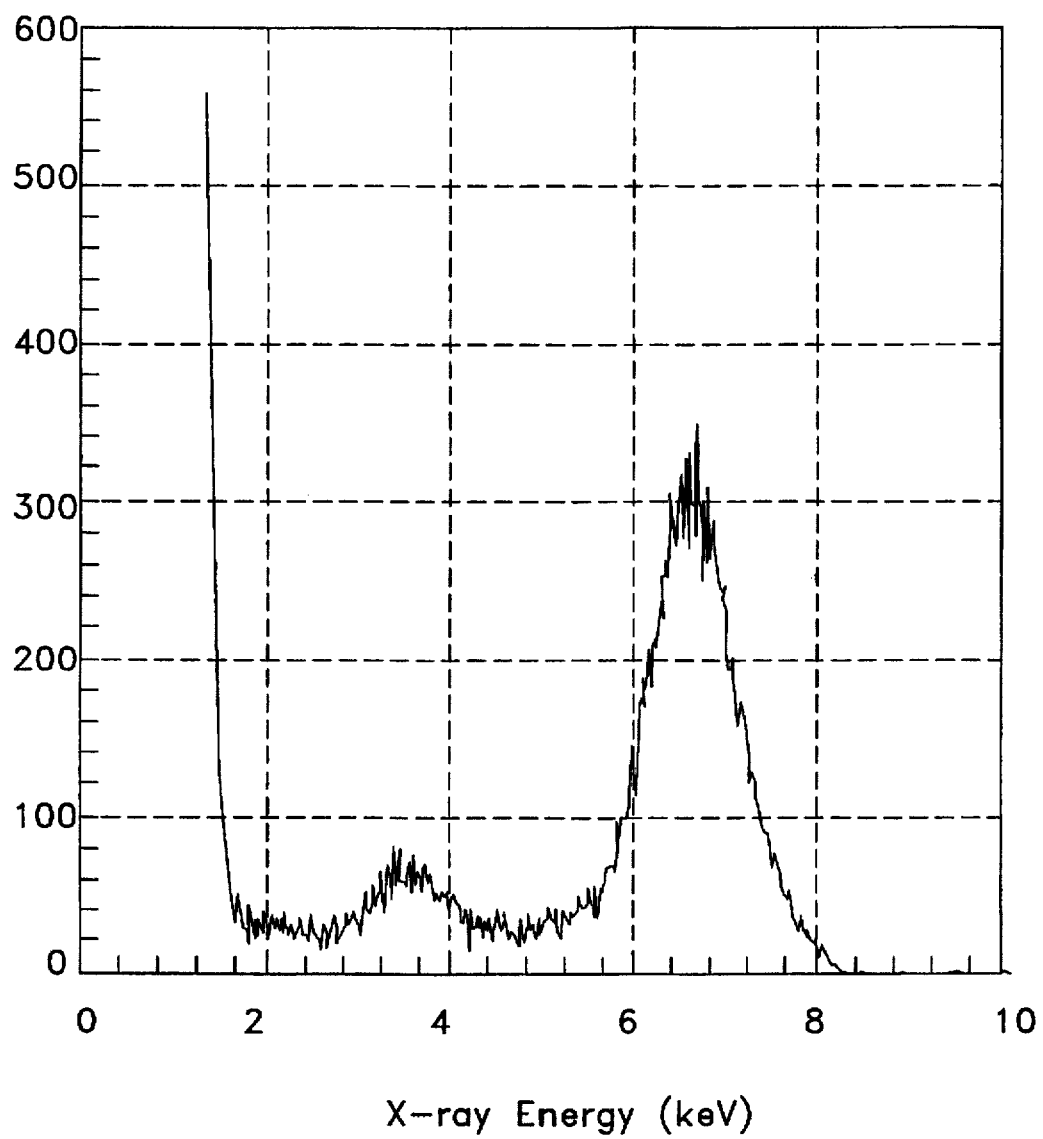
FIGS. 4A and 4B show results of detecting x-rays output from $^{55}$Fe and $^{241}$Am x-ray sources, respectively, using the detector fabricated according to the invention with signal processing electronics of FIG. 3B.
Figure 4B:
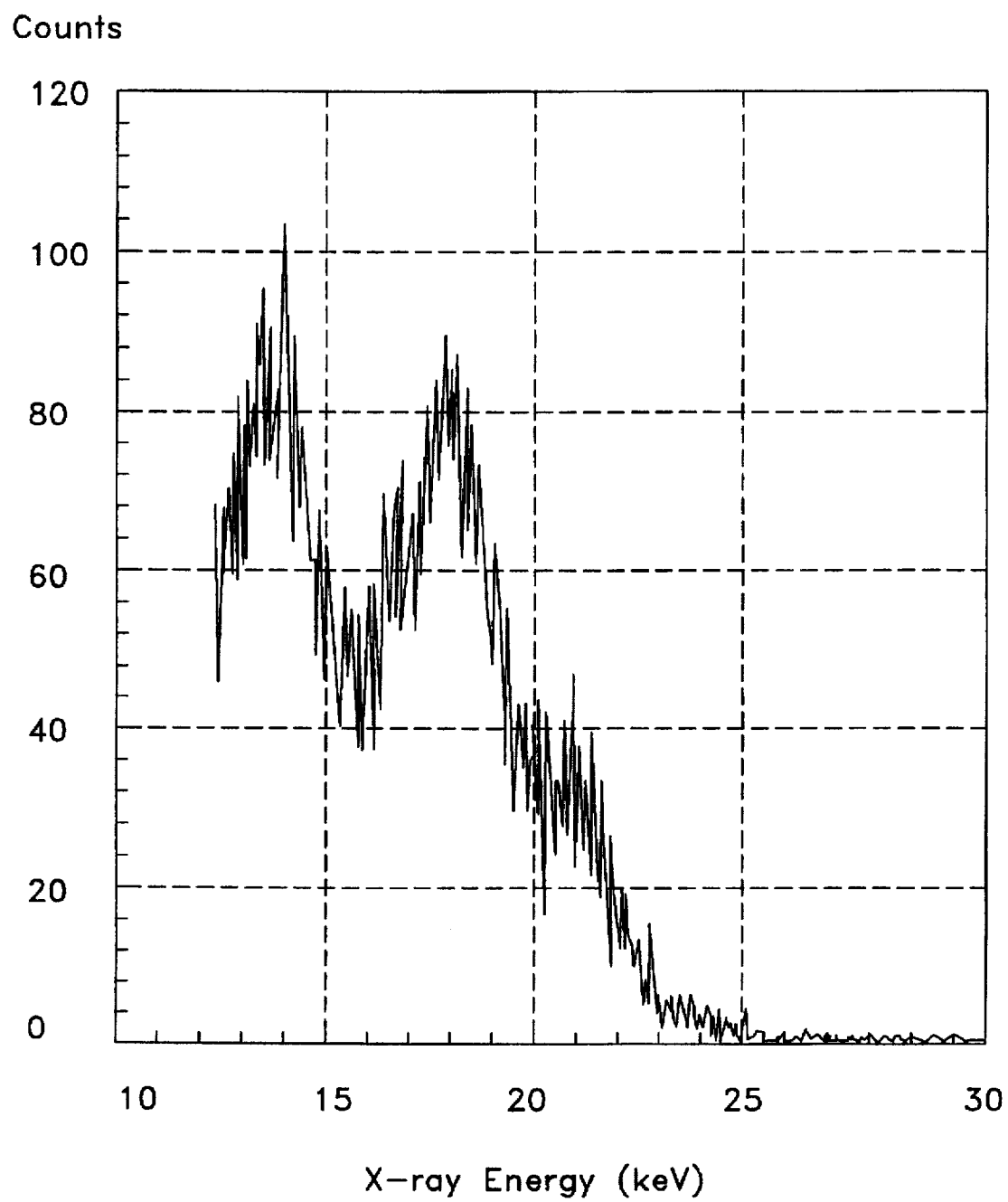

FIGS. 4A and 4B show results of detecting x-rays output from $^{52}$Fe and $^{241}$Am x-ray sources, respectively, using detector 202 fabricated according to the invention with processing electronics 350. $^{55}$Fe has a 5.9 keV emission line, and $^{241}$Am has emission lines at 14, 18, and 21 keV. The measured width of the line at 5.9 keV is 1.0 keV (FWHM), which is considerably better than can be achieved with a scintillation detector such as sodium iodide. In these tests, gas 218 consisted of 90% argon and 10% methane at a pressure of 16 psig. Under these conditions, the efficiency at higher energies for converting x-rays fell for energies greater than 20 keV. The efficiency can be improved, however, by increasing the pressure of gas 218 and switching to a xenon-based gas mixture.

When detector 202 is combined with a modified version of electronics 300, for each anode implementing energy intervals or windows using pairs of comparators, corresponding analog threshold voltages, and logic to provide output pulses for input pulses above the lower threshold but not exceeding the upper threshold for each interval or window. The resulting system should efficiently detect x-rays in the energy range from 1 keV to 150 keV with an energy resolution as low as 1 keV or less and a spatial resolution limited primarily by the pixel size, typically 200 to 100 micrometers. It could be used in digital radiography and computed tomography. In particular, it could acquire energy-resolved images, thus allowing sensitivity to selected chemical elements or compositions. This non-integrated x-ray detector system, one possible version of which is currently under construction, would be useful primarily for research purposes only, since the distributed electronics, the interconnecting cabling, and the high density of electromechanical contacts would make it too bulky, fragile, and susceptible to noise pickup for any but carefully controlled laboratory environments. A much more practical device, described in greater detail below, could be made by combining a microstrip proportional chamber with a complete customized set of signal processing and acquisition electronics fabricated on a semiconductor substrate using standard microelectronics techniques. Such a fully integrated detector would combine a device originally developed for research applications with high-density electronics to make a compact rugged detection system suitable for industrial or possibly even medical uses.

Integration of Detector and Electronics

Previous implementations of microstrip gas proportional chamber technology have used various substrate materials, such as glass, plastic, or even silicon as the mechanical support for the photolithographically defined electrode structures. In the latter case, the silicon was used in such a way as to render impossible incorporation of active signal processing circuits. (See the discussion at the end of the section entitled "Background of the related Art".) A key weakness of all these implementations is that they have used only external electronic signal acquisition circuitry, which results in a rather bulky and fragile system with poor noise immunity due to a large number of long interconnecting cables and poor reliability due to the high number of easily damaged connections.

Figure 5:
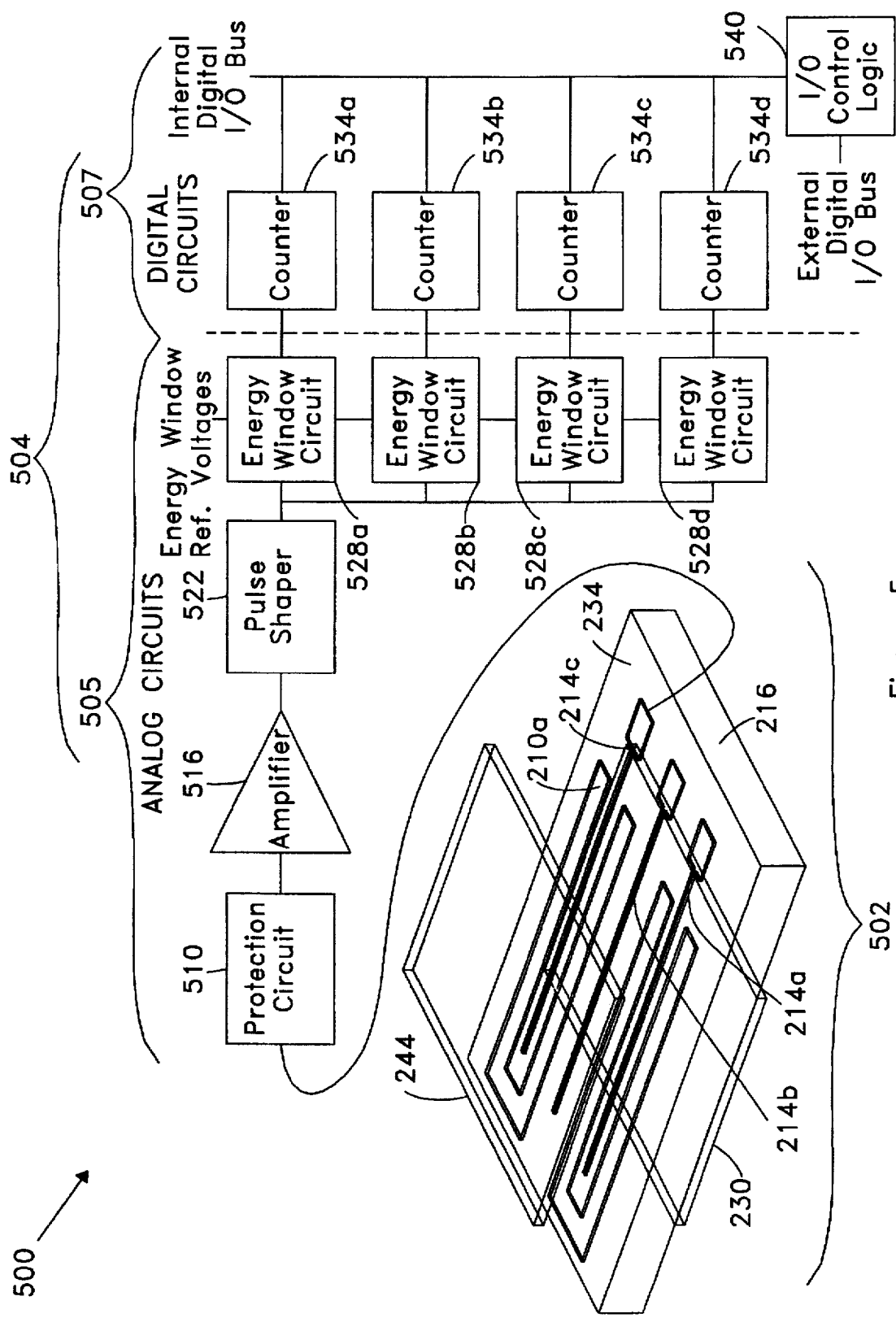
FIG. 5 shows a schematic of an x-ray detection system fabricated according to one embodiment of the invention wherein the signal processing electronics are illustrated for only one of the plurality of microstrip anodes.

Construction of a fully integrated detection system starts from a silicon or other semiconductor wafer containing the circuits needed for the counting chains for each microstrip anode 214a–214c as shown schematically in the block diagram of FIG. 5 for anode 214c. Bipolar, metal-oxide-semiconductor, or other technology may be used to construct the circuits described below. Considerations that affect the choice of device fabrication technology include maximum desired pulse throughput, total power dissipation, device radiation hardness, and cost. Many of the details of the circuit design will be governed by the chosen fabrication technology. We now describe the basic fabrication features required for the detection system without reference to the subtleties of any specific device technology.

Figure 6A:
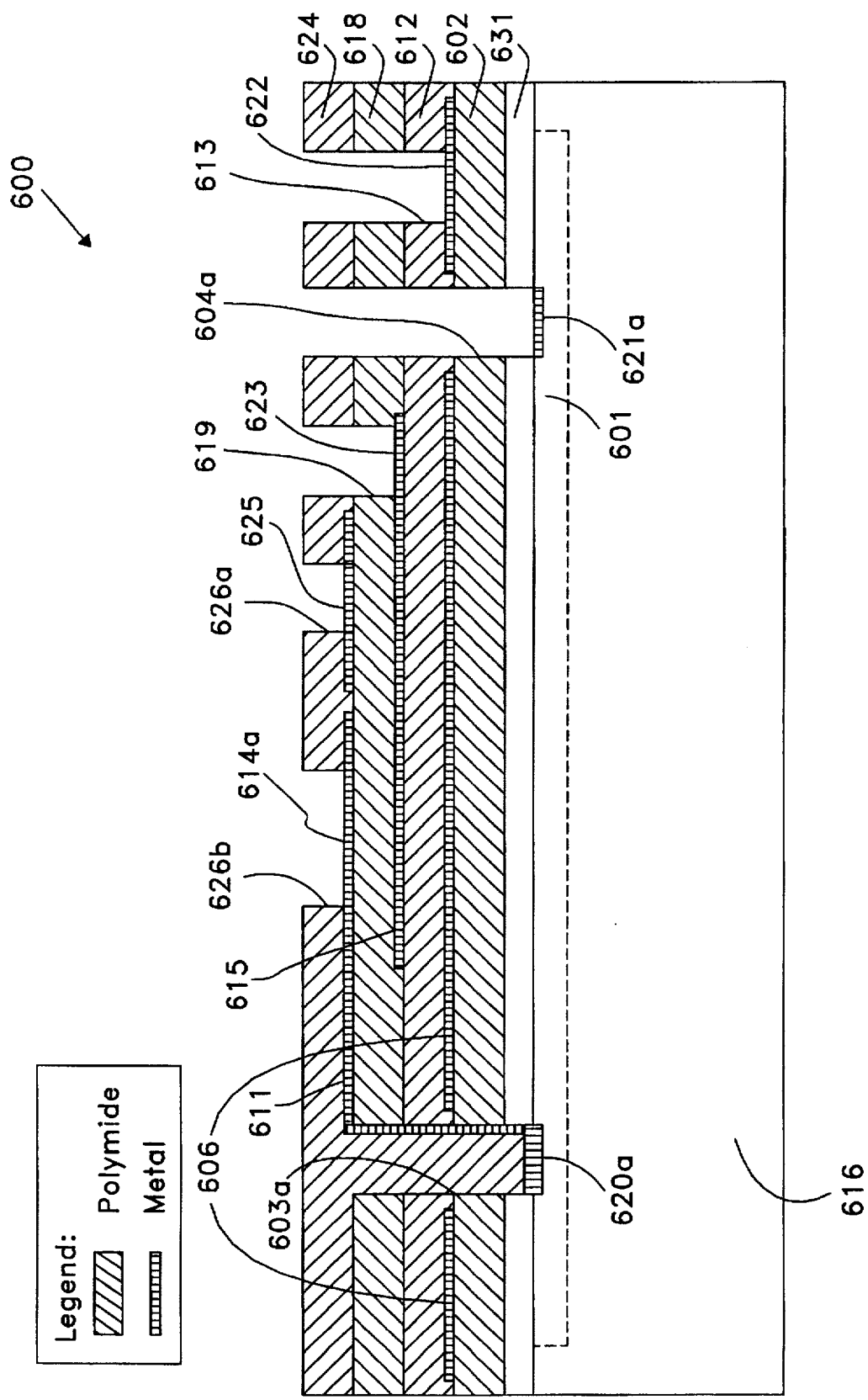
FIG. 6A is a schematic cross sectional view of a wafer containing integrated processing electronics and having a microstrip detector fabricated thereon.

FIG. 5 shows an x-ray detection system 500 fabricated according to one embodiment of the invention and FIG. 6A shows a schematic cross section view of an integrated x-ray detector system 600 corresponding to system 500. As will be discussed, microstrip proportional chamber 502, with the exception of cathode plane 244, is fully integrated in a supporting substrate fabricated along with active signal processing circuits 504 made up of analog circuits 505 and digital circuits 507. Integration of circuits 504 in the supporting silicon substrate allows amplifier 516 and protection circuit 510 to be placed close to anode 214c, thus reducing the pickup of undesired electromagnetic noise. Laying out of the integrated electronics carefully ensures that crosstalk between the circuits corresponding to 504 for the other anodes (not shown) is minimized. Likewise, judicious layout and design are needed to minimize coupling between the digital circuits 507 and the analog circuits 505 for all channels. Since the detection system will necessarily be exposed to high radiation fields, external shielding (not shown) must be used to restrict exposure to a well defined portion of the wafer, which should be kept clear of circuit elements susceptible to radiation damage. This wafer-scale integrated device must be fully passivated and have input and output contact pads appropriate for connection of the subsequently fabricated anodes to the inputs of the signal processing circuitry, for connection of the various analog threshold voltages needed to define the energy windows, and for connection of the digital outputs and control signals.

The right hand side of FIG. 5 shows a conceptual block diagram, which we now describe in greater detail, of one possible embodiment of the signal processing electronic circuits 504 to be fabricated and integrated into the supporting silicon substrate and which are typical for each anode. Following the blocks in sequence, the detector signal at anode 214c is input to protection circuit 510 which prevents damage to the rest of the electronics in the event of a high voltage discharge in detector 502. Protection circuit 510 will typically consist of high speed signal diodes arranged "back-to-back" to clamp the magnitude of the voltage at the input of amplifier 516 such that it does not exceed the forward voltage drop of the diodes, typically 0.6 volts for silicon- A low noise, high bandwidth amplifier 516 converts the charge at its input to a voltage output. Pulse shaper 522 processes the incoming signal using pole-zero cancellation and bandwidth limitations to improve pulse rate throughput while maintaining low noise. The current pulse shape intrinsic to gas proportional detectors consists of a rapidly rising edge followed by a slowly decaying tail. The total integrated charge is proportional to the energy released by the ionizing event. While it is in principle possible to integrate this current pulse to obtain the total charge, the slowly decaying tail would force a long integration time and thus limit the maximum count rate for each detector channel. Since the decay rate of the pulse is fixed by the details of the detector, the initial height of the current pulse is a direct (albeit somewhat less accurate) measure of the total charge. The design parameters of amplifier 516 and pulse shaper 522 are chosen to strike a balance between the accuracy of conversion of total charge to voltage pulse height and maximum count rate throughput. Each energy window circuit 528a–528d that follows consists of a pair of high speed comparators (not shown) with separate externally supplied reference voltages to define upper and lower energy (pulse height) thresholds. Each energy window circuit 528a–528d further includes logic providing a standard digital output if the input pulse voltage is between the lower and upper thresholds. While four such energy window circuits are illustrated, the actual number would depend on the application and could be more or less than four.

Note that the boundary between analog and digital electronics generally lies in the comparators and the associated logic gates of the energy window circuits 528a–528d converting a linear voltage pulse from the pulse shaper 522 to a standard digital logic pulse if the amplitude of that linear voltage pulse falls within one of the defined intervals. Hence, energy window circuits could be considered to be located in either analog circuits 505 or digital circuits 507 and are depicted to be in analog circuits 505 in FIG. 5 for convenience only.

Passing a resulting digital output to counters 534a–534d, respectively, then occurs. Each counter could be implemented, for example, by a cascading of flip-flops with as many as 32 bits. I/O control logic 540 allows sequential readout and control of counters 534a–534d. This on-wafer buffering of data and the ability to multiplex counters 534a–534d during readout is critical as it dramatically reduces the density of connections required.

Energy Window Circuits

In most practical x-ray inspections, a great deal is already known about the specimen under investigation. In particular, its average composition is reasonably well defined. As such, it is unnecessary to acquire full energy spectra. Processing electronics 504 for each anode 214a–214c allow for sitting, by a user the lower and upper energy limits of a small number of independent intervals or windows via energy window circuits 528a–528d. Counters 534a 534d, respectively, are used for summing together pulses falling. Pulses outside all of the set windows are not counted. This allows for the simultaneous collecting of data from several energy ranges, i.e., constructing energy resolved images, each from a different selected window in turn allowing chemical element contrast in radiographs and enabling a new class of x-ray inspections of unprecedented sensitivity which are ideally suited for inspecting composite materials and many other applications.

Fabricating the Integrated X-ray Detector System

Figure 6B:
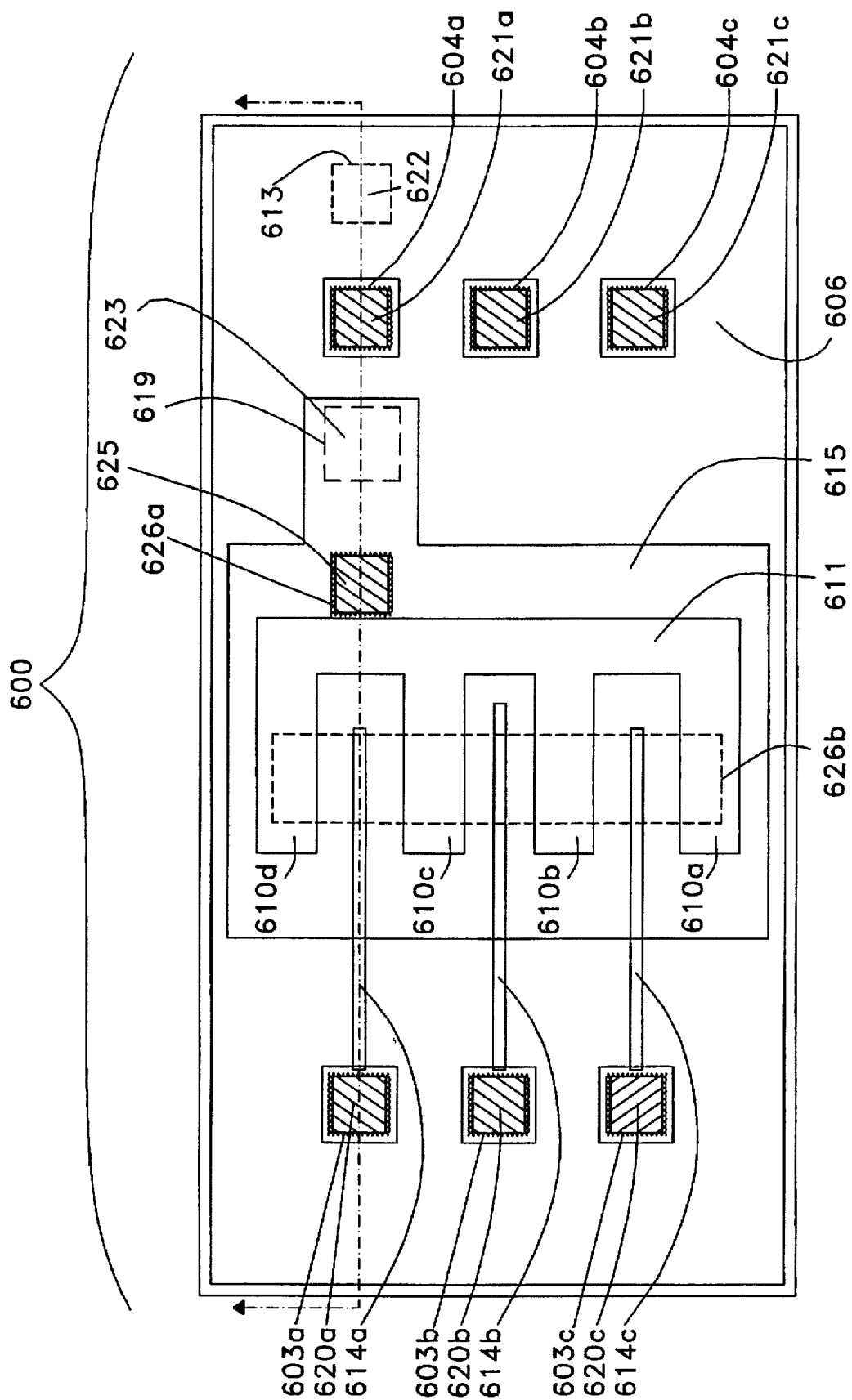
FIG. 6B shows a schematic plane view of the anode/potential strip metal layer of FIG. 6A fabricated according to the invention as seen looking down from the top of FIG. 6A.

Spin casting polyimide resin layers and evaporating metal films are used together with conventional photolithography techniques for building the microstrip gas proportional detector on top of the passivated wafer containing the signal processing circuits and associated contacts as described above. These technologies require relatively low substrate temperatures (typically 250°–350° C. for curing the polyimide) that will not appreciably alter the characteristics of the active devices present in the substrate. FIG. 6A is a schematic cross section view of wafer 616 containing processing electronics 504 in a layer 601 with passivation layer 631. Polyimide layers are represented by a slanted line pattern and metal layers by heavy black lines. FIG. 6B shows a top view of a portion of wafer 616 with metal layers 606, 615, and 611 of FIG. 6A represented by different shades, and with openings through the (transparent) polyimide represented by white dotted lines. Layer 611 consists of potential strips 610a–610d and associated contact 625, which are all continuous, and anodes 614a–614c, which are all separated from each other and from potential strips 610a–610d.

Figure 6C:
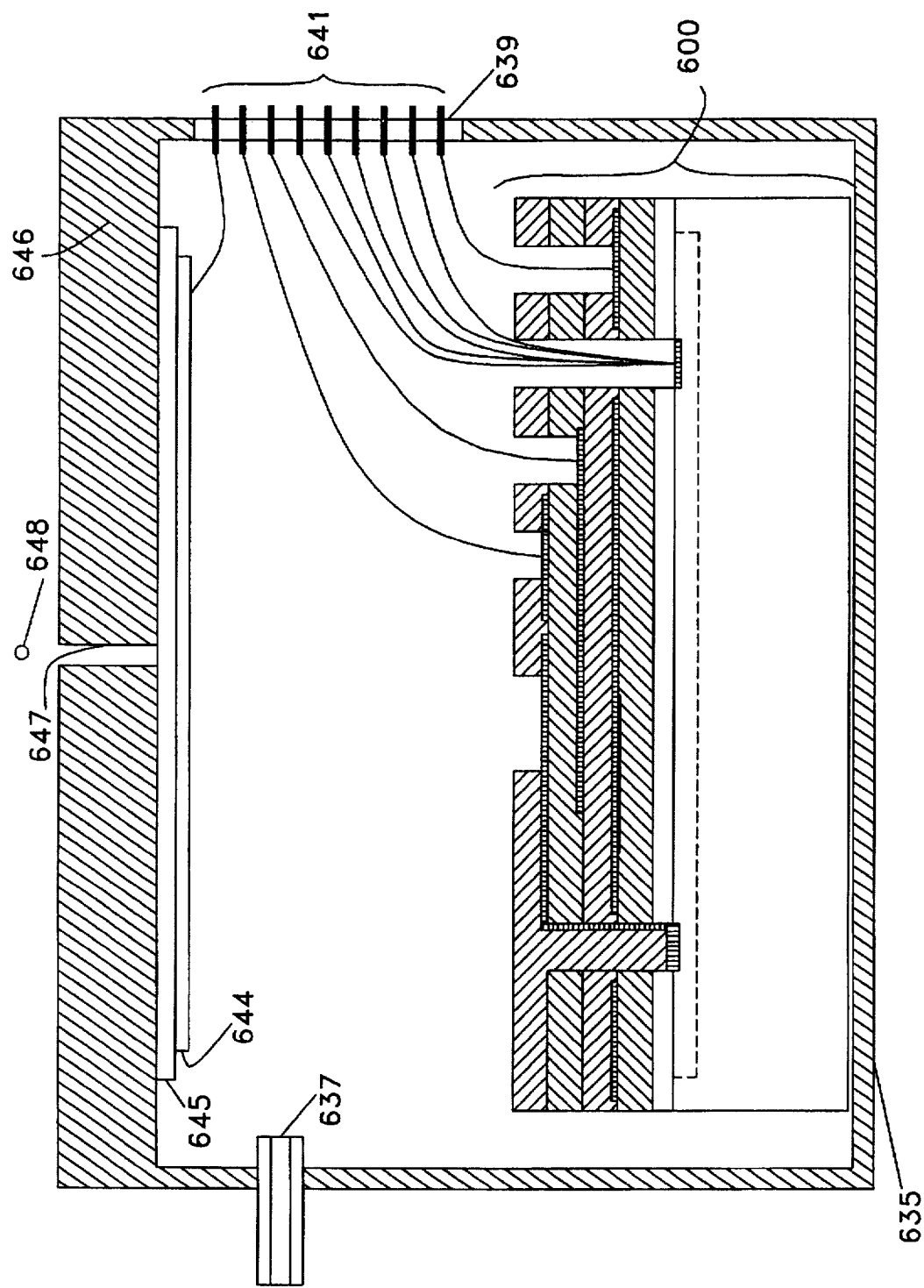
FIG. 6c is a schematic representation of one possible embodiment of the fabricated and assembled detector showing the pressure cell, the x-ray transparent window, the cathode plane, the electrical and gas feedthroughs, and the electrical connections.

The correspondences between features of the simplified schematic representation of a microstrip gas proportional detector of FIG. 2 and those of the integrated version of FIGS. 6A, 6B, and 6C are as follows. Substrate 216 is replaced by polyimide layer 618. Back potential plane 230 is replaced by metal back potential plane 615. Anodes 214a–214c are replaced by anodes 614a–614c. Potential strips 210a–210d are replaced by potential strips 610a–610d. Cathode plane 644 of FIG. 6C corresponds to cathode plane 244 of FIG. 2 and is a separate required feature of the detector system, although it is not integrated into the supporting wafer 616. As discussed above, the cathode plane may be the x-ray transparent window itself, or may be in close proximity to a separate x-ray transparent window 645 and possibly electrically isolated from it.

Before describing in detail the fabrication sequence for constructing the integrated microstrip gas proportional chamber x-ray detector system, we will first mention some general practices used during fabrication. The polyimide resin (either Brewer Science π-Polyim P-18 or OCG Microelectronic Materials Probimide 514) is applied by spin coating at a speed and for a time required to yield the desired film thickness (typically 10 to 15 micrometers) according to the resin manufacturer's data. Thicker films have been obtained by spin coating multiple layers of resin. To remove solvents, baking of each is done before subsequent processing steps, and partial curing is done according to the resin manufacturer's instructions if wet etch patterning is needed. Positive photoresist (Hoechst-Celanese AZ 1350J-SF) has been used for all lithography steps. Tetramethylammonium hydroxide based photoresist developer (Hoechst-Celanese AZ 312 MIF) has been used both for etching the exposed photoresist and for wet etching the partially cured polyimide resin. The liftoff technique has been used for patterning all metal layers. After final curing according to the resin manufacturer's instructions, all polyimide layers requiring either subsequent metal deposition or application of additional polyimide resin layers are etched in an oxygen plasma for microscopic roughening of the polymer surface to promote adhesion. In addition, metal layers are generally composites made up of a thin (10–200 Å) titanium layer for improving adhesion to the polyimide, a thicker layer of the primary metal (approximately 1 micrometer), and for those primary metals that require protecting from oxidation a thin (500–600 Å) layer of gold.

Figure 6D:
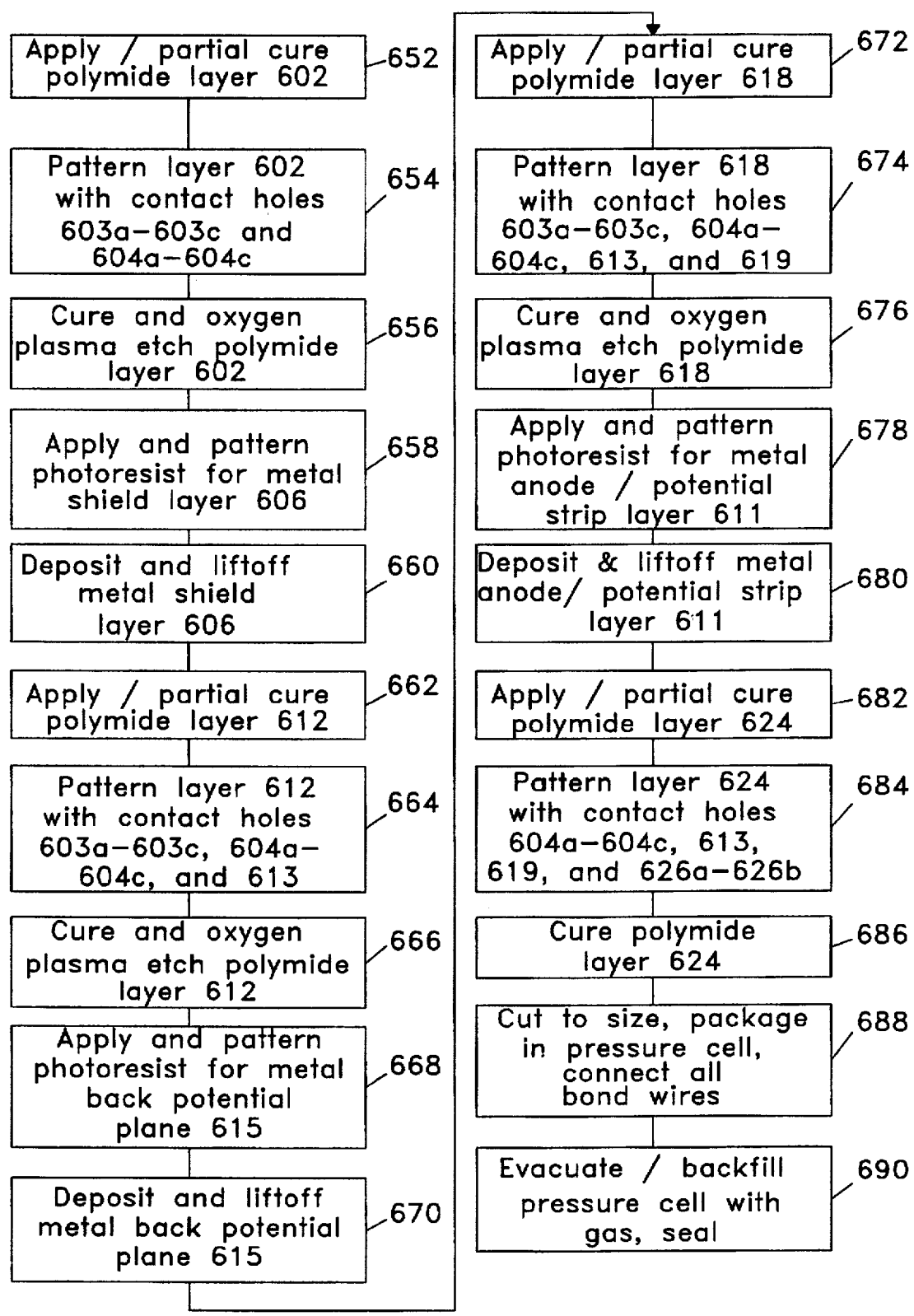
FIG. 6D shows process steps for building the detector system shown in FIGS. 6A–6C.

FIG. 6D summarizes the process steps needed to fabricate an integrated microstrip gas proportional chamber x-ray detection system..Refer to FIGS. 6A–6C to see schematic representations of the various fabricated elements described below and their relative locations. At step 652 of FIG. 6D, apply polyimide resin layer 602 on top of passivation layer 631 over fabricated integrated signal processing circuits 504 in layer 601 of wafer 616 and partially cure to permit subsequent patterning by wet etching. Pattern layer 602 at step 654 with contact holes 603a–603c and 604a–604c needed to expose anode signal contacts 620a–620c and analog threshold input and digital signal contacts 621a–621c, respectively, by coating layer 602 with photoresist, exposing the photoresist with ultraviolet light through a mask, and etching both the exposed photoresist and the underlying partially cured polyimide resin with the photoresist developer mentioned above. After stripping the residual photoresist, fully curing layer 602 is done according to the resin manufacturer's instructions and then oxygen plasma etching it to prepare the surface for subsequent processing at step 656. To use the liftoff technique to for patterning metal layers, applying photoresist and using a mask and ultraviolet light for patterning metal shield layer 606 are both done at step 658. Depositing the metal for shield layer 606 and removing the excess by liftoff in acetone both occur at step 660. Applying and partially curing polyimide resin layer 612 occurs at step 602 patterning layer 612 at step 664 with contact holes 603a–603c and 604a–604c for exposing contacts 620a–620c and 621a–621c, respectively, and with contact hole 613 for defining shield plane 606 contact 622. Stripping the residual photoresist, fully curing layer 612, and oxygen plasma etching the surface is done at step 666. Applying and patterning photoresist for metal back potential plane 615 occurs at step 668. Depositing and lifting off metal for back potential plane 615 is accomplished at step 670. Applying and partially curing polyimide resin layer 618 is accomplished at step 672. Patterning layer 618 with contact holes 603a–603c, 604a–604c, and 613 for exposing contacts 620a–620c, 621a–621c, and 622, respectively, and with contact hole 619 to defining back potential plane 615 contact 623 takes place at step 674. Stripping the residual photoresist, fully curing layer 618, and oxygen plasma etching the surface happens at step 676. Applying and patterning photoresist for metal anode/potential strip layer 611 occurs at step 678. Depositing and lifting off metal for anode potential strip layer 611 is done at step 680, defining anodes 614a–614c and potential strips 610a–610d. Note that electrically connecting anodes 614a–614c and analog signal input contacts 620a–620c is automatically accomplished through contact holes 603a–603c, respectively, when the anodes 614a–614c are created at steps 678 and 680. This is because the design of the masks for the lithography of step 678 insures registration between the ends of anodes 614a–614c and contacts 620a–620c. Applying and partially curing polyimide resin layer 624 is done at step 682. Patterning layer 624 occurs at step 684 with contact holes 604a–604c, 613, and 619 exposing contacts 621a–621c, 622, and 623, respectively, and with open areas 626a–626b for defining potential strip contact 625 and the active detector area. At step 686, stripping the residual photoresist and fully curing polyimide layer 624 is accomplished. The surface conductivity of the detector 600 may be modified at this point by applying coatings implanting ions, or other means to alter performance characteristics if desired. Cutting device 600 to size, packaging in pressure cell 635 (see schematic diagram of FIG. 6C), connecting all necessary power, threshold, and signal bond wires to pins 641 of hermetically sealed electrical feedthrough 639, and closing the assembly occurs at step 688. Evacuating the pressure cell, backfilling with the desired detector gas, and sealing the cell assembly using sealable gas inlet 637 occurs at step 690. Pressure cell 635 may have radiation shielding 646 with slit 647 for limiting and radiation from source 648 to a narrow portion of detector 600 corresponding to the active area defined by 626b.

Other substrates that support microelectronic device fabrication, such as gallium arsenide or silicon-on-insulator materials, could be substituted for monocrystalline silicon as wafer 616. Other dielectric materials common in microelectronic fabrication processes could be used in place of polyimide resin. For example, depositing silicon oxide by low temperature techniques such as plasma enhanced chemical vapor deposition or ozone/TEOS or depositing silicon nitride deposited by similar techniques, as well as silicon oxynitride. Other polymer resins could be substituted for the polyimide. The patterning of polyimide or other polymer dielectrics could be done by using a spin-on-glass mask material followed by plasma etching. The various metal layers could be fabricated by depositing (deposition) followed by either wet or dry etching rather than by liftoff. Implementing electronic processing circuits 504 could be done with either bipolar or MOS device technologies. With appropriate changes in design, signals from anodes 614a–614c could be coupled to protection circuit 510 by capactive coupling rather than by direct coupling, thus allowing for operating the anodes 614a–614c at elevated voltages. Other variations include segmenting back potential plane 615 to implement a two dimensional array using capacitive coupling. This would require significantly modifying the signal processing electronics for permitting coincidence counting for obtaining separate x and y coordinates of ionizing events. If an improvement in noise immunity were needed, moving the counters off the detector wafer and building them into a separate piece of silicon is possible. This latter hybrid configuration would reintroduce the problem of a large number of interconnections, but might be an appropriate compromise for applications where dissipating power or analog/digital noise coupling considerations force mixing signal processing electronics technologies.

What is claimed is:

1. A method for fabricating an integrated x-ray detection system, comprising the steps of:

integrating a plurality of active signal processing circuits into a wafer having a corresponding plurality of digital input/output contacts, said plurality of active signal processing circuits receiving pulses at a respective plurality of active signal inputs and processing said pulses to output digital information at said corresponding plurality of digital input/output contacts;

forming an isolating layer over said plurality of active signal processing circuits; and applying a polyimide layer over said wafer having a plurality of vias, said plurality of vias exposing said plurality of digital input/output contacts; and fabricating an x-ray detector over said wafer by metal deposition and application of insulating layers at temperatures sufficiently low such that said plurality of active signal processing circuits are not damaged, said x-ray detector having alternating potential strip and a plurality of anodes being electrically coupled to said plurality of active signal processing circuits, wherein said x-ray detector receives x-ray photons and outputs pluses at particular ones of said plurality of anodes closest to said x-ray photons, said active signal processing circuits processing said pulses and outputting digital information indicating locations and energies of said x-ray photons at said plurality of digital input/output contacts, wherein said isolating layer electrically isolates said x-ray detector from said plurality of signal processing circuits.

2. The method for fabricating an integrated x-ray detection system according to claim 1, further comprising the step of:

applying a metal shield layer between said plurality of active signal processing circuits and said x-ray detector for shielding said plurality of active signal processing circuits from electromagnetic radiation.

3. The method for fabricating an integrated x-ray detection system according to claim 2, wherein said step of applying said metal shield layer further comprises fabricating a plurality of vias in said metal shield layer corresponding to said plurality of vias in said polyimide layer.

4. The method for fabricating an integrated x-ray detection system according to claim 3, wherein said step of fabricating an x-ray detector further comprises electrically coupling said plurality of anodes to said plurality of active signal processing circuits through said further plurality of vias in said metal shield layer and through said plurality of vias in said polyimide layer.

5. The method for fabricating an integrated x-ray detection system according to claim 1, further comprising the step of:

applying a metal back potential plane between said plurality of active signal processing circuits and said x-ray detector for receiving a potential during operation to establish a control electrostatic field.

6. The method for fabricating an integrated x-ray detection system according to claim 1, further comprising the steps of:

mounting said wafer in a pressure cell; and connecting each of said plurality of digital input/output contacts and at least one of said plurality of anodes to a corresponding pin of a plurality of pins mounted in said pressure cell.

7. The method for fabricating an integrated x-ray detection system according to claim 6, further comprising the steps of:

mounting a cathode plane in said pressure cell; and connecting said cathode plane to a corresponding pin of said plurality of pins mounted in said pressure cell.

8. The method for fabricating an integrated x-ray detection system according to claim 6, further comprising the steps of:

evacuating said pressure cell;

backfilling said pressure cell with a detector gas; and sealing said pressure cell.

9. The method for fabricating an integrated x-ray detection system according to claim 6, further comprising the step of:

mounting an x-ray transparent window in said pressure cell.

10. A method for fabricating a system, comprising the steps of:

providing a wafer capable of supporting integrated circuitry;

integrating a plurality of active signal processing circuits into said wafer;

fabricating a plurality of anodes on said wafer, wherein said plurality of active signal processing circuits are respectively coupled into said plurality of anodes;

arranging a plurality of potential strips alternately among said plurality of anodes;

arranging a cathode plane along said wafer;

fabricating a back potential plane on said wafer;

separating said plurality of anodes, said plurality of potential strips, and said back potential plane from said plurality of active signal processing circuits with an insulation layer; and housing said wafer and providing a gas in a housing.

11. A method of fabricating a integrated microstrip gas proportional chamber x-ray system, comprising the steps of:

applying and processing a first polyimide resin layer on top of a passivation layer over a plurality of integrated signal processing circuits in a layer of a wafer;

depositing and lifting off metal for a shield layer on top of said first polyimide resin layer;

applying and processing a second polyimide layer on top of said shield layer;

depositing and lifting off metal for a back potential plane on top of said second polyimide layer;

applying and processing a third polyimide layer on top of said back potential plane;

depositing and lifting off metal for an anode and potential strip layer on top of said third polyimide layer automatically connecting portions of said anode and potential strip layer to said plurality of integrated signal processing circuits;

applying and processing a fifth polyimide layer on top of said anode and potential strip layer;

cutting said wafer to size and package in a pressure cell;

connecting bond wires disposed on said wafer to pins of a feedthrough passing through said pressure cell; and evacuating and backfilling said pressure cell with a gas, and sealing said system.

12. A method of fabricating an integrated device, comprising the steps of:

applying and processing a first polyimide resin layer on top of a passivation layer over a plurality of integrated signal processing circuits in a layer of a wafer;

depositing and lifting off metal for a shield layer on top of said first polyimide resin layer;

applying and processing a second polyimide layer on top of said shield layer;

depositing and lifting off metal for a back potential plane on top of said second polyimide layer;

applying and processing a third polyimide layer on top of said back potential plane;

depositing and lifting off metal for an anode and potential strip layer on top of said third polyimide layer automatically connecting portions of said anode and potential strip layer to said plurality of integrated signal processing circuits; and applying and processing a fifth polyimide layer on top of said anode and potential strip layer.

* * * * *